United States Patent [19]
Korb et al.

[11] Patent Number: 5,582,642
[45] Date of Patent: Dec. 10, 1996

[54] APPARATUS AND METHOD FOR ADJUSTING THE POSITION OF A PULL WIRE OF A CRYSTAL PULLING MACHINE

[75] Inventors: Harold Korb, Ballwin; Dick S. Williams, St. Charles; Richard G. Schrenker, Chesterfield; Verlin A. Lauher, Ballwin, all of Mo.

[73] Assignee: MEMC Electronic Materials, Inc., St. Peters, Mich.

[21] Appl. No.: 492,666

[22] Filed: Jun. 20, 1995

[51] Int. Cl.$^6$ ..................................................... C30B 35/00
[52] U.S. Cl. ............................ 117/218; 117/200; 117/208
[58] Field of Search ........................... 73/862.42, 862.44; 117/200, 201, 202, 208, 218; 356/153, 325

[56] References Cited

U.S. PATENT DOCUMENTS

| | | | |
|---|---|---|---|
| 4,886,647 | 12/1989 | Ikeda et al. | 422/250 |
| 4,915,775 | 4/1990 | Katsuoka et al. | 422/249 |
| 4,916,955 | 4/1990 | Katsuoka et al. | 73/862.44 |
| 4,969,745 | 11/1990 | Ibe | 356/375 |
| 5,020,907 | 6/1991 | Ibe | 356/153 |
| 5,089,239 | 2/1992 | Mizuishi et al. | 422/249 |
| 5,106,593 | 4/1992 | Mizuishi et al. | 422/249 |
| 5,234,664 | 8/1993 | Drechsel | 422/249 |
| 5,254,319 | 10/1993 | Oda et al. | 422/249 |
| 5,288,366 | 2/1994 | Holder | 156/617.1 |

FOREIGN PATENT DOCUMENTS

| | | | |
|---|---|---|---|
| 0396284 | 11/1990 | European Pat. Off. | 117/218 |
| 3028186 | 2/1991 | Japan | 117/218 |
| 5000885 | 1/1993 | Japan | 117/218 |

OTHER PUBLICATIONS

Servometer Flexible Shaft Couplings brochure, Servometer Corp., Bulletin No. RCP 1093, pp. 1–8.

Micro Slides for Precision Linear Motion Catalog, Micro Slides Corp., Catalog MS–6R, (Jul. 23, 1984).

*Primary Examiner*—R. Bruce Breneman
*Assistant Examiner*—Felisa Garrett
*Attorney, Agent, or Firm*—Senniger, Powers, Leavitt & Roedel

[57] ABSTRACT

A method of laterally adjusting the position of a pull wire of a crystal pulling machine to dampen pendular motion of the pull wire during production of a monocrystal comprises: placing a close-fitting guide around the pull wire; rotating the pulling chamber about the axis $Z_1$ to rotate both the pull wire and the monocrystal supported by the pull wire; sensing the lateral position of a portion of the pull wire; adjusting the lateral position of the guide in response to the sensed position of the pull wire to dampen pendular motion of the pull wire during production of a monocrystal.

37 Claims, 7 Drawing Sheets

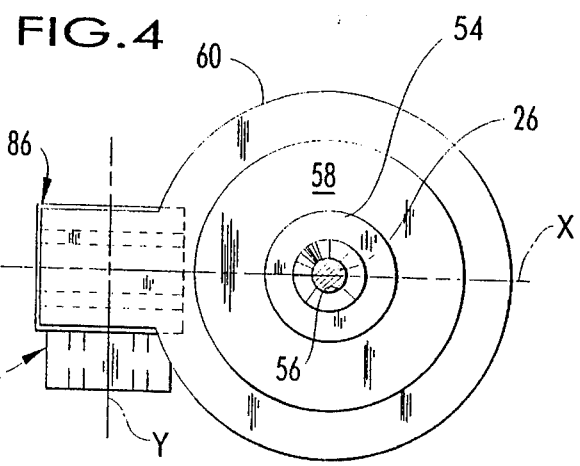
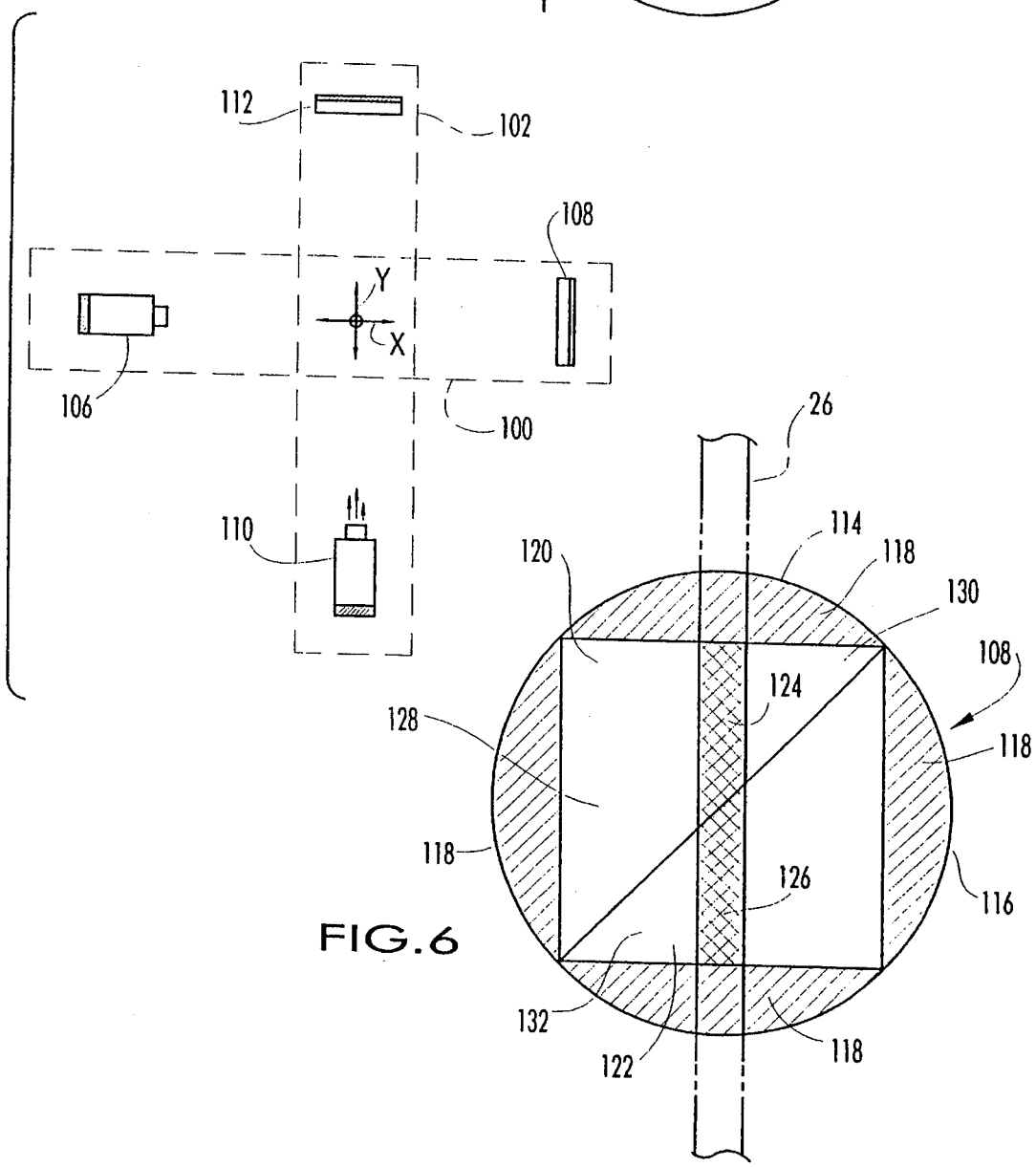

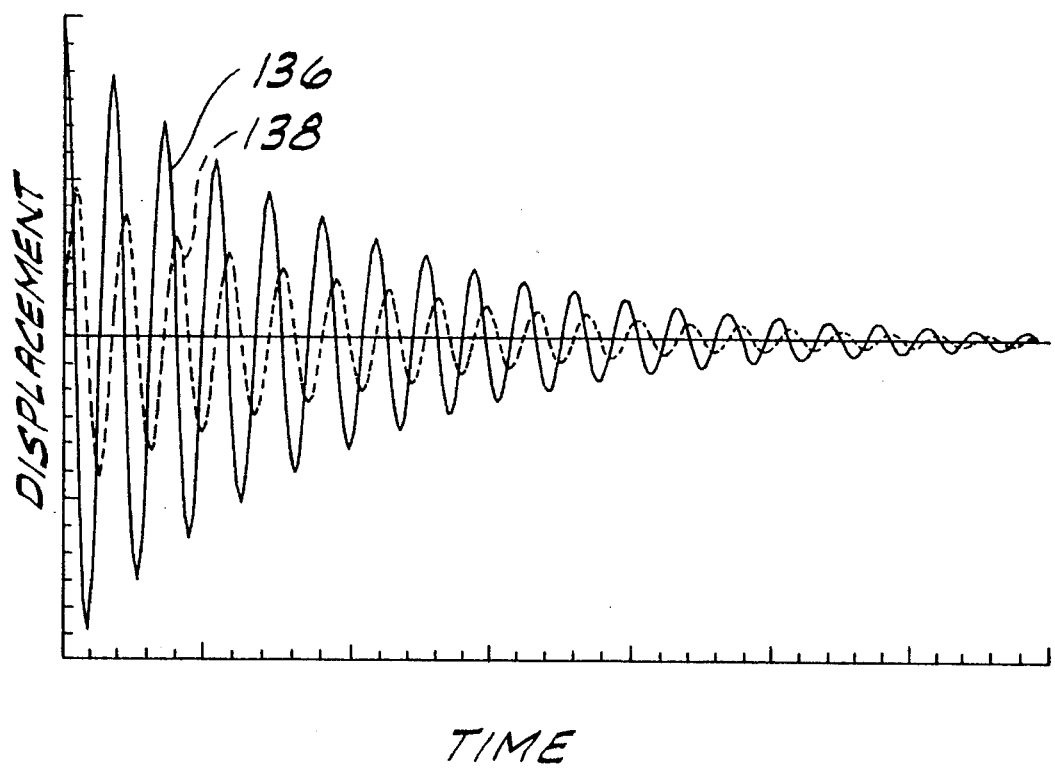

5,582,642

APPARATUS AND METHOD FOR ADJUSTING THE POSITION OF A PULL WIRE OF A CRYSTAL PULLING MACHINE

BACKGROUND OF THE INVENTION

This invention relates generally to crystal pulling machines and more particularly to a method and apparatus for adjusting the position of a pull wire of a crystal pulling machine.

The substantial majority of monocrystalline silicon used to make silicon wafers for the microelectronics industry is produced by crystal pulling machines employing the Czochralski method. Briefly described, the Czochralski method involves melting chunks of high-purity polycrystalline silicon in a quartz crucible located in a specifically designed furnace to form a silicon melt. A relatively small seed crystal is mounted above the crucible on the lower end of a pull wire hanging from a crystal lifting mechanism for raising and lowering the seed crystal. The seed crystal is lowered into contact with the molten silicon in the crucible. When the seed begins to melt, it is slowly withdrawn from the molten silicon and starts to grow, drawing silicon from the melt. During the growing process, the crucible is rotated in one direction and the crystal lifting mechanism, wire, seed, and crystal are rotated in an opposite direction.

A problem encountered in such crystal pulling machines is pendular motion (i.e., swinging or orbiting) of the wire and crystal during the growing process. Pendular motion may be caused by eccentricity (i.e., misalignment) of the pull wire centerline with respect to the axis of rotation of the crystal lifting mechanism. Such eccentricity may be due in part to imperfections in the concentricity and precision of bearing assemblies used for rotating the crystal lifting mechanism. Pendular motion may also be caused by factors which arise during crystal production, such as asymmetrical crystal growth and/or external disturbances.

Pendular motion of the pull wire and crystal during crystal production imparts bending load stresses to the neck of the crystal. If the bending stresses are too high, the neck may break and the crystal may fall into the crucible, thereby ruining the crystal. Even smaller pendular motions (i.e., pendular motions which are insufficient to break the neck of the crystal) are detrimental to crystal production. Such pendular motions may cause crystal distortion or impede the ability of diameter sensors and controllers to detect and control crystal diameter. They may also result in dislocations in or otherwise reduce the quality of the produced crystal.

SUMMARY OF THE INVENTION

Among the several objects and features of this invention may be noted the provision of an improved apparatus and method for reducing pendular motion of a pull wire of a crystal pulling apparatus; the provision of such apparatus and method for reducing eccentricity of the pull wire centerline with respect to the axis of rotation of the crystal lifting mechanism; the provision of such apparatus and method for adjusting the position of a pull wire; the provision of such apparatus and method for actively dampening pendular motion of a pull wire; and the provision of such apparatus and method which is simple to use.

Generally, apparatus of the present invention is constructed for adjusting the position of a pull wire of a crystal pulling machine of the type which produces monocrystals by the Czochralski method. The crystal pulling machine includes a growth chamber, a crucible in the growth chamber, a pulling chamber above the growth chamber, a rotatable support operatively mounted on the pulling chamber for rotation relative to the pulling chamber about a generally vertical axis $Z_1$, a crystal lifting mechanism supported by the rotatable support for rotation with the support, and a pull wire extending downward from the lifting mechanism for supporting a crystal. The apparatus comprises a guide bushing and an adjustment mechanism. The guide bushing has an opening therethrough for passage of the pull wire. The adjustment mechanism is for laterally adjusting the position of the bushing relative to the axis $Z_1$ and relative to the crystal lifting mechanism in at least two non-collinear lateral directions to thereby laterally adjust the position of the pull wire.

In another aspect of the present invention, apparatus is adapted for adjusting the position of a pull wire of a crystal pulling machine to dampen pendular motion of the pull wire during production of a monocrystal. The apparatus comprises a guide, at least one position sensor, an actuator mechanism, and a controller. The guide has an opening therethrough for passage of the pull wire. The position sensor is adapted for generating a position signal representative of the lateral position of a portion of the pull wire, and the actuator mechanism is adapted for adjusting the lateral position of the guide. The controller is responsive to the position signal for controlling the actuator mechanism as a function of the position of the pull wire as represented by the position sensed by the sensor to dampen pendular motion of the pull wire during production of a monocrystal.

In another aspect of the present invention, a method of laterally adjusting the position of a pull wire of a crystal pulling machine comprises: placing a guide bushing around the pull wire, the guide bushing having an opening therethrough for passage of the pull wire; and laterally adjusting the position of the guide bushing relative to the axis $Z_1$ and relative to the rotatable support to align the pull wire with the axis $Z_1$.

In another aspect of the present invention, a method of laterally adjusting the position of a pull wire of a crystal pulling machine to dampen pendular motion of the pull wire during production of a monocrystal comprises: placing a guide bushing around the pull wire, the guide bushing having an opening therethrough for passage of the pull wire; rotating the pulling chamber about the axis $Z_1$ to rotate both the pull wire and the monocrystal supported by the pull wire; sensing the lateral position of a portion of the pull wire; adjusting the lateral position of the guide bushing in response to the sensed position of the pull wire to dampen pendular motion of the pull wire during production of a monocrystal.

Other objects and features will be in part apparent and in part pointed out hereinafter.

BRIEF DESCRIPTION OF THE DRAWINGS

FIG. 4 is a cross-sectional view taken along the plane of line 4—4 of FIG. 2;

FIG. 5 is a cross-sectional view taken along the plane of line 5—5 of FIG. 2 schematically showing first and second position sensors for sensing the position of the pull wire;

FIG. 6 is an enlarged front elevational view of a first masked photodiode assembly of the first position sensor of FIG. 5;

FIG. 7 is displacement vs. time graph representing dampening of a pull wire;

Corresponding reference characters indicate corresponding parts throughout the several views of the drawings.

DESCRIPTION OF THE PREFERRED EMBODIMENT

Figure 1:
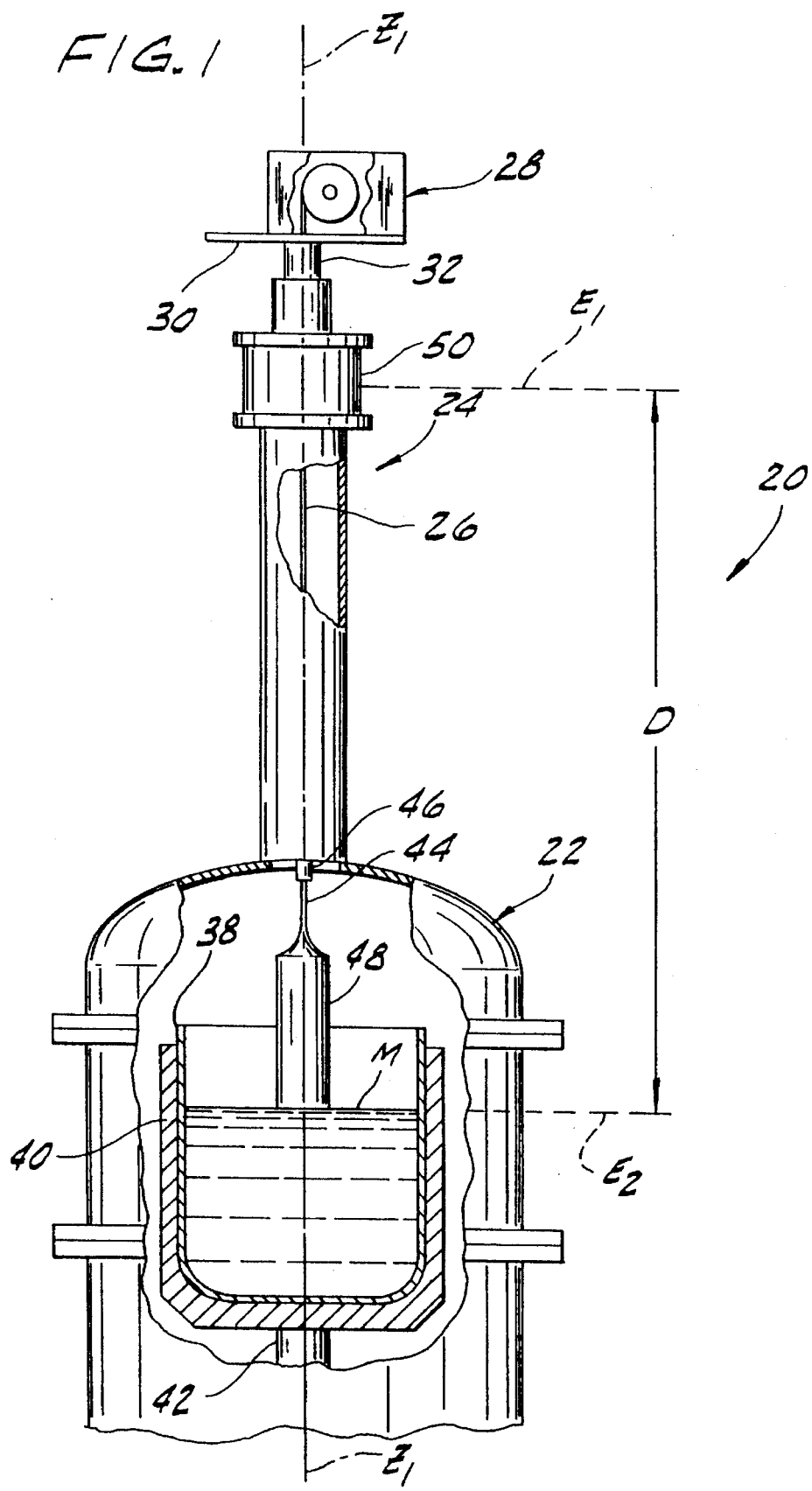
FIG. 1 is a schematic side elevational view of a crystal pulling machine having a wire positioning apparatus of this invention with portions of the machine broken away to show detail.
Figure 2:
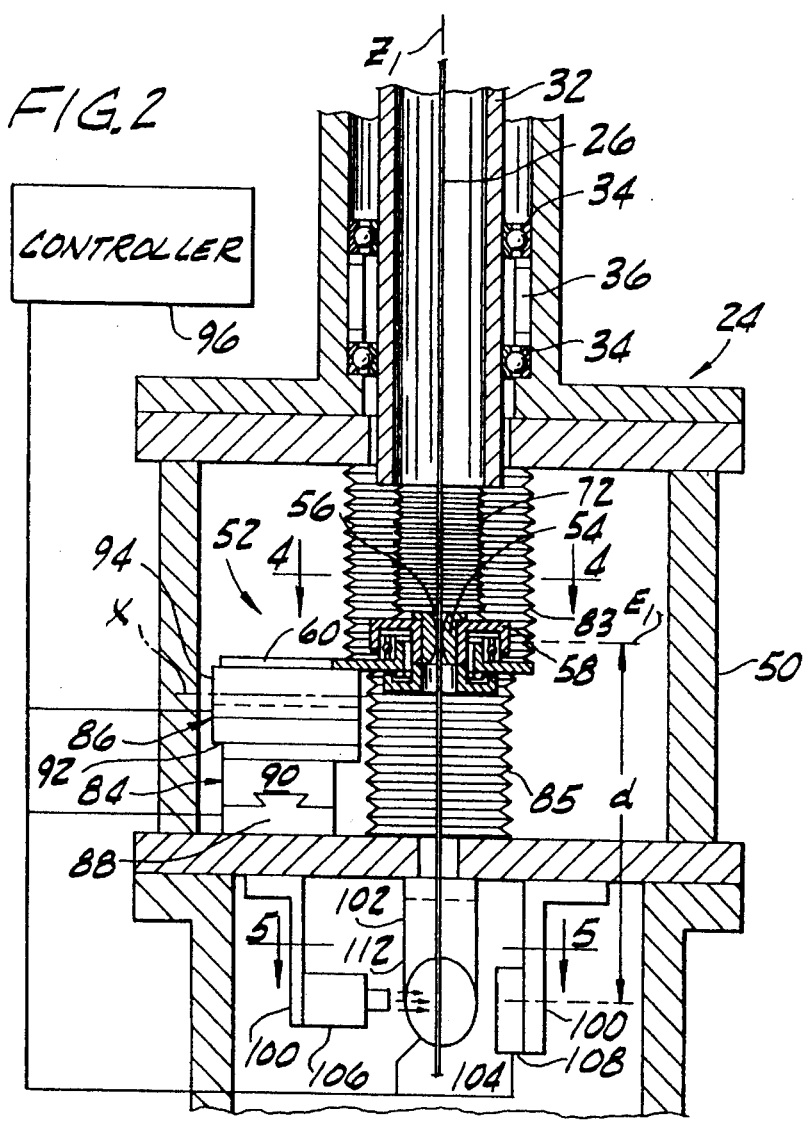
FIG. 2 is an enlarged fragmented section view of the crystal pulling machine of FIG. 1 showing the wire positioning apparatus.

Referring now to the drawings, and first more particularly to FIGS. 1 and 2, a crystal pulling machine of the type which produces monocrystals by the Czochralski method is indicated in its entirety by the reference numeral 20. The crystal pulling machine 20 includes a growth chamber, generally indicated at 22, and an elongate pulling chamber, generally indicated 24, above the growth chamber. A pull wire 26 depends from a crystal lifting mechanism, generally indicated at 28, which operates like a winch to selectively reel in and let out the pull wire. The crystal lifting mechanism 28 is securely mounted on a plate 30 which is secured to the top of and rotates with a rotatable shaft 32 (or support). The shaft 32 is coupled to the pulling chamber 24 via suitable bearings 34 (FIG. 2) and may be rotated relative to the pulling chamber by a suitable motor (not shown) for rotation of the shaft, plate, and crystal lifting mechanism 28 about a generally vertical axis $Z_1$ (FIG. 1). Preferably, a high-integrity rotating vacuum seal 36 (FIG. 2) is between the shaft 32 and pulling chamber 24 for sealing against fluid leakage.

A crucible 38 in the growth chamber 22 containing molten crystal source material M (e.g., high-purity silicon) is held by a cup-shaped turntable 40 for rotation on a turntable shaft 42 depending from the turntable. A suitable motor (not shown) rotates the turntable shaft 42, turntable 40, and crucible 38 about an axis which is preferably collinear with the vertical axis $Z_1$ (i.e., the axis of rotation of the crystal lifting mechanism). During the crystal growing process, the turntable 40 and crucible 38 are rotated in the opposite direction of (i.e., counter-rotated with) the shaft 32, plate 30, and crystal lifting mechanism 28.

During the crystal growing process, a seed crystal 44 (FIG. 1) is held at the lower end of the pull wire 26 via a seed chuck 46. The crucible 38 and pull wire 26 are counter-rotated and the seed crystal 44 is lowered into contact with the molten silicon in the crucible. When the seed crystal 44 begins to melt, it is slowly withdrawn from the molten silicon via the crystal lifting mechanism 28 and starts to grow, drawing silicon from the melt to form a crystal ingot 48.

A top portion of the pulling chamber 24 comprises a positioner housing 50 which houses a wire positioning apparatus generally indicated at 52 in FIG. 2. The wire positioning apparatus 52 is adapted for actively dampening pendular motion of the pull wire 26 during the crystal growing process. It includes an annular guide bushing 54 defining a central opening 56 for passage of the pull wire 26. The opening 56 in the guide bushing 54 is sized for a close sliding fit of the pull wire 26 through the opening and is preferably sized for a maximum clearance of approximately 0.0005 inches. Because of the close fit, the pull wire 26 will move laterally with lateral movement of the guide bushing 54 and may be raised and lowered relative to the guide bushing. Preferably, the guide bushing 54 is made of polytetrafluoroethylene or other suitable material to minimize friction between the bushing and pull wire 26 as the pull wire is raised and lowered.

Figure 3:
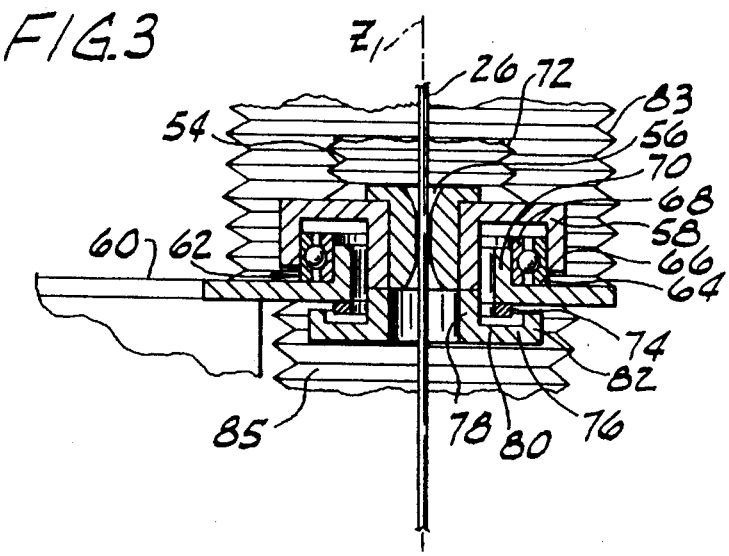
FIG. 3 is an enlarged fragmented view of a guide bushing, bushing carrier, and adjustable support plate of the wire positioning apparatus of FIG. 2.

The guide bushing 54 is secured to a bushing carrier 58 which is rotatably coupled to an adjustable support plate 60 by a bearing assembly generally indicated at 62 for rotation of the bushing and bushing carrier about an axis $Z_2$ (FIG. 3). The bearing assembly 62 has an outer race 64 secured to a downwardly projecting annular flange 66 of the bushing carrier 59 and an inner race 68 secured to an upwardly projecting annular flange 70 of the support plate 60. Preferably, the bearing assembly 62 is a high-precision bearing assembly for minimizing lateral movement (play) of the bushing 54 and bushing carrier 58 relative to the support plate 60. Thus, lateral movement of the support plate 60 causes lateral movement of the guide bushing 54.

The bushing carrier 58 is connected to the shaft 32 via a flexible shaft coupling 72 such as a bellows-type coupling sold under the trademark Servometer®. The shaft coupling 72 causes the bushing carrier 58 and guide bushing 54 to rotate with the shaft 32 while allowing lateral movement of the bushing carrier and bushing relative to the shaft.

A first annular seal member 74 (FIG. 3) is secured to the underside of the support plate 60 and a second seal member 76 is secured to the bushing carrier 58. The second seal member 76 has a cylindric portion 78 depending from the bushing carrier 58, an outwardly projecting annular flange 80 extending from the bottom of the cylindric portion and projecting under the first seal member 74, and an upstanding annular flange 82 at the outer periphery of the outwardly projecting annular flange and disposed generally circumferentially about the first seal member. The first and second seal members 74, 76 constitute a labyrinth seal for preventing silicon oxide from passing upward between the bushing carrier 58 and support plate and contaminating the bearing assembly 62. Upper and lower flexible bellows 83, 85, preferably made of stainless steel, connect the support plate 60 to the positioner housing 50 for maintaining an evacuated chamber in the positioner housing while permitting lateral movement of the support plate relative to the positioner housing.

The support plate 60 is laterally moveable by first and second linear slide assemblies 84, 86, shown schematically in FIGS. 2 and 4. The slide assemblies 84, 86 constitute actuator mechanisms for adjusting the lateral position of the guide bushing 54. The first slide assembly 84 includes a base member 88 and a slider member 90 adapted for sliding on the base member rearwardly and forwardly along an axis Y (i.e., up and down as viewed in FIG. 4). The second slide assembly 86 includes a base member 92 and a slider member 94 adapted for sliding on the base member side-to-side along an axis X (i.e., right to left as viewed in FIGS. 2 and 4). Preferably, the slide assemblies 84, 86 are motor actuated slides powered by electric motors (not shown). An example of such a slide assembly is an Electro-Slide™, available from Micro Slides Inc., Westbury, N.Y. The base member 88 of the first slide assembly 84 is secured to the positioner housing 50. The base member 92 of the second slide assembly 86 is secured to and moveable with the slider member 90 of the first slide assembly 84. The support plate 60 is secured to and moveable with the slider member 94 of the second slide assembly 86. Movement of the slider member 90 of the first slide assembly 84 along the axis Y causes linear movement of the support plate 60 and second slide assembly 86 in first (forward) and second (rearward) opposite directions (i.e., in and out of the page as viewed in FIG. 2, and up and down as viewed in FIG. 4). Movement of the slider member 94 of the second slide assembly 86 along the axis X causes linear movement of the support plate 60 in third and fourth opposite directions (i.e., from right to left as viewed in FIGS. 2 and 4). Preferably, the third and fourth directions are generally perpendicular to the first and second directions. Since the guide bushing 54 moves laterally with the support plate 60, movement of the slider members 90, 94 causes lateral movement of the guide bushing and pull wire 26.

Although the slide assemblies 84, 86 constitute the preferred means for adjusting the lateral position of the guide bushing 54, it is to be understood that other actuator mechanisms could be employed without departing from the scope of this invention. For example, the actuator mechanisms could comprise solenoids, hydraulic cylinders, servomotor driven screw assemblies, or any other suitable mechanism for laterally moving the support plate 60.

Actuation of the slide assemblies is controlled by a suitable controller 96 (schematically shown in FIG. 2) based on the position of the pull wire 26 as sensed by first and second position sensors 100, 102 (FIGS. 2 and 5) extending downward from the underside of the positioner housing 50. The position sensors 100, 102 sense the lateral position of a portion 104 of the pull wire 26 located a set distance d (FIG. 2) below the elevation $E_1$ of the guide bushing 54. Preferably, the distance d is at least approximately 5% of a distance D between the elevation $E_1$ of the guide bushing 54 and the elevation $E_2$ of the surface of the molten crystal source material M. For ease of understanding, x- and y-coordinate planes have been included in FIG. 5. The first position sensor 100 senses a y-coordinate value of the wire portion 104 (i.e., senses the distance of the wire portion from the x-coordinate plane) and the second position sensor 102 senses an x-coordinate value of the wire portion (i.e., senses the distance of the wire portion from the y-coordinate plane). The first position sensor 100 comprises a first light-emitting diode 106 and a first masked photodiode assembly 108. The second position sensor 102 comprises a second light-emitting diode 110 and a second masked photodiode assembly 112. For simplification, only the first position sensor 100 will be described in detail. However, it is to be understood that the second position sensor 102 operates in the same manner.

Referring now to FIG. 6, the first masked photodiode assembly 108 comprises upper and lower semicircular-shaped photodiodes 114, 116 masked at their outer peripheries by a suitable masking 118 to form corresponding upper and lower triangular-shaped unmasked portions 120, 122. Illumination of the unmasked portion of each photodiode generates an electric signal (e.g., an electric current or voltage). An increase in illumination increases the signal and a decrease in illumination decreases the signal. The first light-emitting diode 106 constitutes a collimated light source for illuminating the upper and lower unmasked portions 120, 122 of the photodiodes 114, 116. The first position sensor 100 is oriented so that the wire portion 104 is between the first light-emitting diode 106 and first photodiode assembly 108. In this arrangement, the wire portion 104 shades an area 124 of the upper unmasked portion 120 and an area 126 of the lower unmasked portion 122. The first light-emitting diode 106 uniformly illuminates unshaded areas 128, 130 of the upper unmasked portion 120 and unshaded areas 132, 134 of the lower unmasked portion 122. Movement of the pull wire 26 forward (i.e., toward the bottom of the page as viewed in FIG. 5) causes the shaded areas 124, 126 to move to the right in FIG. 6; movement of the pull wire forward (i.e., upward toward the top of the page as viewed in FIG. 5) causes the shaded areas to move to the left in FIG. 6.

The size of the shaded area 124 of the upper unmasked portion 120 increases as it moves rearward (to the left as viewed in FIG. 6) and decreases as it moves forward (to the right as viewed in FIG. 6). Since the area of the upper unmasked portion 120 is constant, the sum of the unshaded areas 128, 130 decreases as the shaded area moves rearward (left) and increases as the shaded area moves forward (right). Because the light energy illuminating the unshaded areas 128, 130 is uniformly distributed, the electric signal generated by the upper photodiode 114 increases as the shaded area 124 moves to the left and decreases as the shaded area moves to the right. Accordingly, the signal generated by the upper photodiode 114 is a function of the size of the unshaded area of the upper unmasked portion and therefore a function of the lateral position of the pull wire 26 (i.e., a function of the y-coordinate value of the wire portion 104). The y-coordinate value of the wire portion 104 can therefore be determined by the magnitude of the signal of the upper photodiode 114.

Although the y-coordinate value of the wire portion may be determined by the upper photodiode 114, use of the lower photodiode 116 in conjunction with the upper photodiode increases sensitivity. Because of the shape and orientation of the lower unmasked portion 122, the lower photodiode 116 operates 116 in an opposite manner as the upper photodiode 114. In particular, the sum of the unshaded areas 132, 134 of the lower photodiode 116 increases as the shaded area 126 moves to the left and decreases as the shaded area 126 moves to the right. Thus, the signal generated by the lower photodiode 116 increases as the shaded area 126 moves rearward (i.e., as the pull wire moves toward the top of the page as viewed in FIG. 5), and decreases as the shaded area moves forward. Sensitivity is increased by subtracting the signal generated by the lower photodiode 116 from the signal generated by the upper photodiode 114 to arrive at a signal remainder (hereinafter, position signal). The position signal from the first photodiode assembly 108 will have a zero value when the shaded areas 124, 126 are centered as shown in FIG. 6, will have a positive value when the shaded areas move to the right and will have a negative value when the shaded areas move to the left.

The controller 96 is responsive to the position signal generated by the first photodiode assembly 108 for controlling the first slide assembly 84 as a function of the position of the pull wire 26 to dampen pendular motion in the first and second directions. As discussed below, the controller 96 is also responsive to the position signal generated by the second photodiode assembly 112 for controlling the second slide assembly 86 as a function of the position of the pull wire 26 to dampen pendular motion in the third and fourth directions. The controller 96 may comprise one or more processors, such as a Zilog Z180 processor or an Intel 486® processor, for controlling the slide assemblies.

Pendular motion of the pull wire 26 is sensed by the first photodiode assembly 108 which generates a generally periodic (e.g., sinusoidal) position signal in response thereto. Based on the position signal, the controller 96 can determine the pendular frequency and position of the portion 104 of the pull wire 26 relative to the bushing 54. The controller 96 may include suitable logic for filtering high frequencies (e.g., frequencies greater than 1 hz) from the position signal so that the position signal is representative only of pendular motion of the pull wire 26. In response to the position signal, the controller 96 energizes the first slide assembly 84 to control the position of the guide bushing 54. Additional position sensors (not shown), such as shaft encoders on the shafts of the slide motors or any other suitable sensors, may be employed for sensing the position of the slide assemblies or guide bushing. Preferably, the first slide assembly 84 is controlled by the controller 96 to move the guide bushing 54 in a periodic motion having the same frequency as the position signal but lagging the position signal by approximately ¼ cycle. Also preferably, the first slide assembly 84 moves the guide bushing 54 with an amplitude substantially less than the amplitude of motion sensed by the first photodiode assembly 108 to thereby provide an underdamped system.

FIG. 7 is a representative graph showing: (1) motion of the pull wire 26 (as sensed by the first photodiode assembly 108) as the pull wire is dampened by motion of the bushing; and (2) dampening motion of the guide bushing 54 as controlled by the controller 96. The solid line 136 represents motion of the pull wire 26 and the dashed line 138 represents motion of the guide bushing 54. As shown in the graph, the controller 96 causes the guide bushing 54 to move with the same frequency as the pull wire 26, but ¼ cycle out of phase with (and lagging) the pull wire. The controller 96 also controls the first slide assembly 84 to decrease the magnitude of motion of the guide bushing 54 as the magnitude of motion of the pull wire 26 decreases. Preferably, the guide bushing 54 is displaced by the first slide assembly 84 a set fraction (e.g. 10%) of the sensed position of the pull wire 26. If a greater dampening rate is desired, the fraction can be increased; if a lesser dampening rate is desired, the fraction can be decreased. Thus, the controller 96 controls the first slide assembly 84 to dampen a component (e.g., y-coordinate component) of pendular motion of the pull wire 26. In other words, the first slide assembly 84 dampens pendular motion in the first and second directions.

The second photodiode assembly 112 detects motion of the pull wire 26 in the third and fourth directions (i.e., detects an x-coordinate component of the pendular motion) and generates a position signal representative of such motion. In response to such signal, the controller 96 controls the second slide assembly 86 to move the guide bushing 54 in the third and fourth directions (i.e., side-to-side) to dampen motion of the pull wire 26 in the third and fourth directions. It is to be understood that the second position sensor 102, controller 96, and second slide assembly 86 combine to dampen motion of the pull wire 26 in the third and fourth directions in substantially the same way the first position sensor 100, controller, and first slide assembly 84 dampens motion in the first and second directions. For sake of brevity therefore, application of these components to dampen motion in the third and fourth directions will not be discussed in greater detail.

In operation, the pull wire 26 may orbit the axis of rotation $Z_1$ or exhibit some other pendular motion during formation of the crystal ingot 48. The first position sensor 100 detects y-coordinate motion of the wire portion spaced the distance d (e.g., eight inches) below the guide bushing 54 and generates a position signal representative of the y-coordinate motion. Simultaneously therewith, the second position sensor 102 detects x-coordinate motion of the wire portion and generates a position signal representative of the x-coordinate motion. In response to the position signal generated by the first position sensor 100, the controller 96 causes the slider member of the first slide assembly 84 to slide on its corresponding base member along the Y-axis (FIG. 4) to move the guide bushing 54 and pull wire 26 therewith and thereby dampen y-coordinate pendular motion of the pull wire 26. In response to the position signal generated by the second position sensor 102, the controller 96 causes the slider member of the second slide assembly 86 to slide on its corresponding base member along the X-axis to move the guide bushing 54 and pull wire 26 therewith and thereby dampen x-coordinate pendular motion of the pull wire 26. In this manner, pendular motion of the pull wire 26 is actively dampened during the entire production phase of the crystal ingot.

Although the photodiode assemblies are preferably analog-type photodiodes, it is to be understood that digital-type photodiodes (e.g., an array of photodiodes) could be used without departing from the scope of this invention. It is also to be understood that the positioning sensors could be replaced by any other suitable positioning sensor without departing from the scope of this invention.

Figure 8:
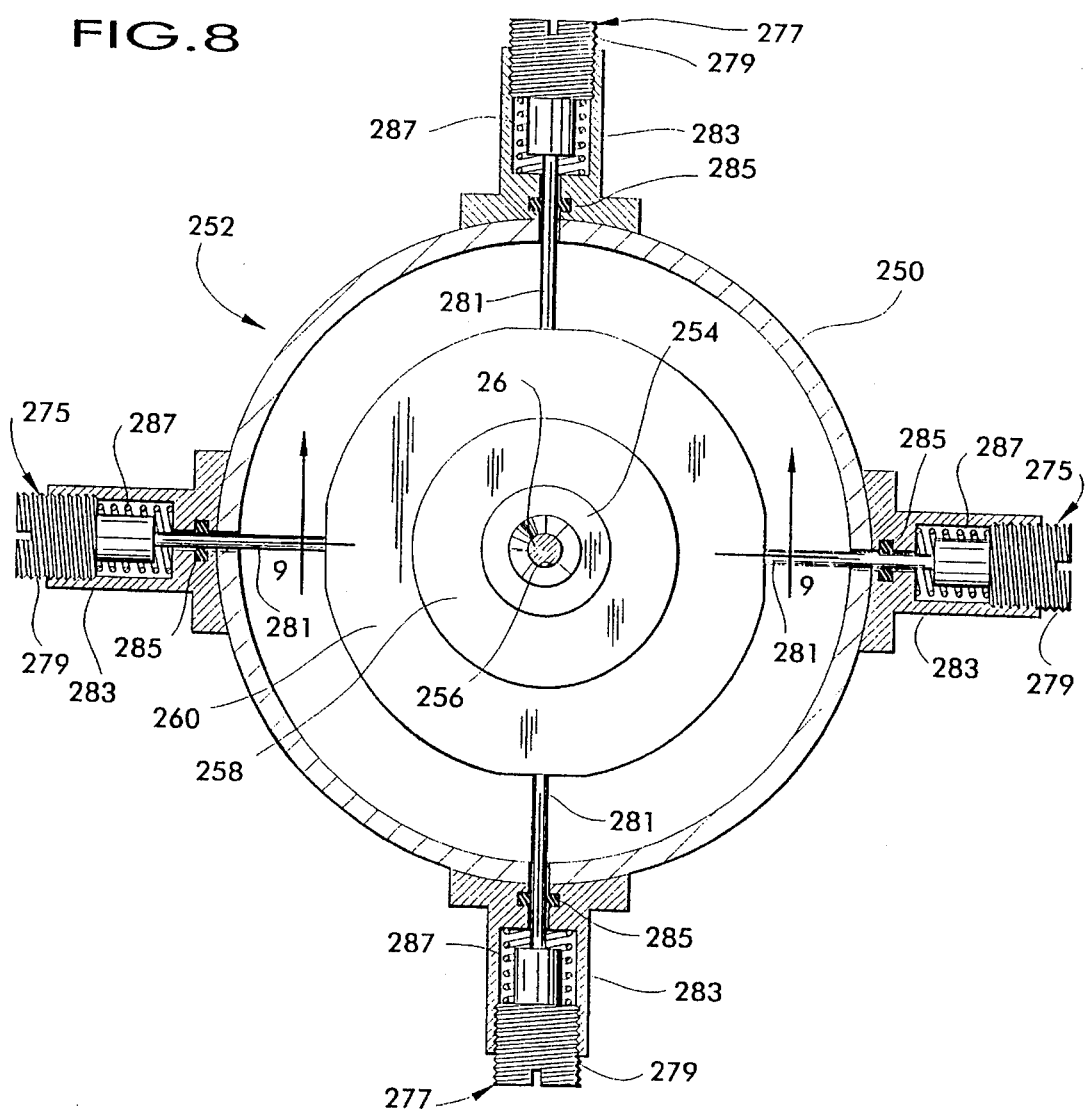
FIG. 8 is a sectional view similar to FIG. 4 of a second embodiment of a wire positioning apparatus of the present invention.
Figure 9:
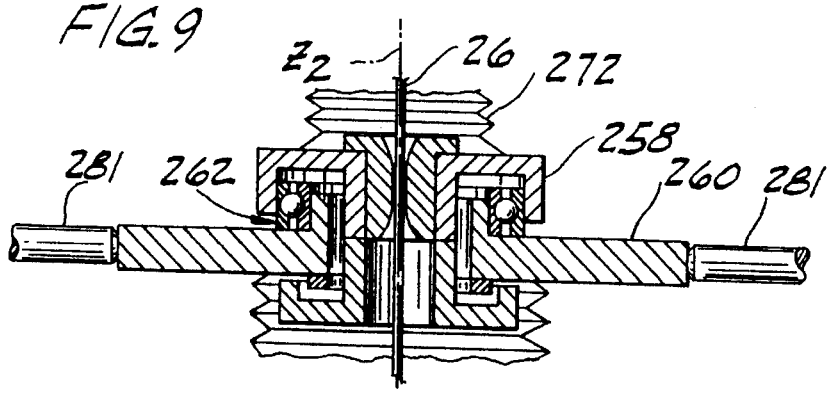
FIG. 9 is a cross-sectional view taken along the plane of line 9—9 of FIG. 8.

Another embodiment of a wire positioning apparatus of the present invention is indicated generally at 252 in FIGS. 8 and 9. The wire positioning apparatus 252 is similar to wire positioning apparatus 52 except it is adapted for adjusting the position of the wire only before a crystal growing process and not during such process. Thus, the wire positioning apparatus 252 does not actively dampen pendular motion. For convenience, corresponding parts are numbered the same as those parts shown in FIGS. 2–4 except the prefix "2" has been added to the reference numbers.

The wire positioning apparatus 252 includes an annular guide bushing 254 defining a central opening 256 for passage of the pull wire 26. The pull wire 26 will move laterally with lateral movement of the guide bushing 254 and may be raised and lowered relative to the guide bushing. The guide bushing 254 is secured to a bushing carrier 258 which is rotatably coupled to an adjustable support plate 260 by a bearing assembly generally indicated at 262 for rotation of the bushing and bushing carrier about an axis $Z_2$ (FIG. 9). A flexible shaft coupling 272 connects the bushing carrier 258 to the rotatable shaft (not shown). The shaft coupling 272 causes the bushing carrier 258 and guide bushing 254 to rotate with the shaft while allowing lateral movement of the bushing carrier and bushing relative to the shaft.

The support plate 260 is adjustably coupled to the positioner housing 250 via first and second pairs of adjustment screws 275, 277. Each adjustment screw has a threaded body 279 and an elongate stem 281 projecting radially inwardly from the threaded body. The threaded body 279 of each adjustment screw is threaded into a corresponding threaded socket 283 of the positioner housing 250. The elongate stem 281 of each adjustment screw extends into the positioner housing 250 and abuts the periphery of the support plate. Preferably, 0-ring seals 285 are disposed circumferentially about the stems 281 of the adjustment screws to prevent fluid leakage into or out of the pull chamber. Also preferably, compression springs 287 are within the sockets 283 for eliminating play between the threads of the screws and the threads of the sockets. Turning the first pair of adjustment screws 275 in their corresponding sockets 283 linearly moves the support plate 260 side-to-side (i.e., to the left or to the right as viewed in FIG. 8). Turning the second pair of adjustment screws 277 in their corresponding sockets 283 linearly moves the support plate 260 rearward or forward (i.e., upward toward the top of the page or downward toward the bottom of the page as viewed in FIG. 8). Since the guide bushing 254 and bushing carrier 258 move laterally with the support plate 260, movement of the support plate laterally adjusts the position of the axis $Z_2$ (i.e., the axis of rotation of the guide bushing 254) relative to the axis $Z_1$ (i.e., the axis of rotation of the crystal lifting mechanism). Preferably, the position of the axis $Z_2$ (FIG. 9) is adjusted to align with the axis $Z_1$ and thereby eliminate any eccentricity of the pull wire centerline with respect to the axis of rotation of the crystal lifting mechanism.

Although adjustment screws are described as being the preferred mechanism of adjusting the lateral position of the support plate 260 wire positioning apparatus 252, it is to be understood that any suitable adjustment mechanism could be employed without departing from the scope of this invention.

Figure 10:
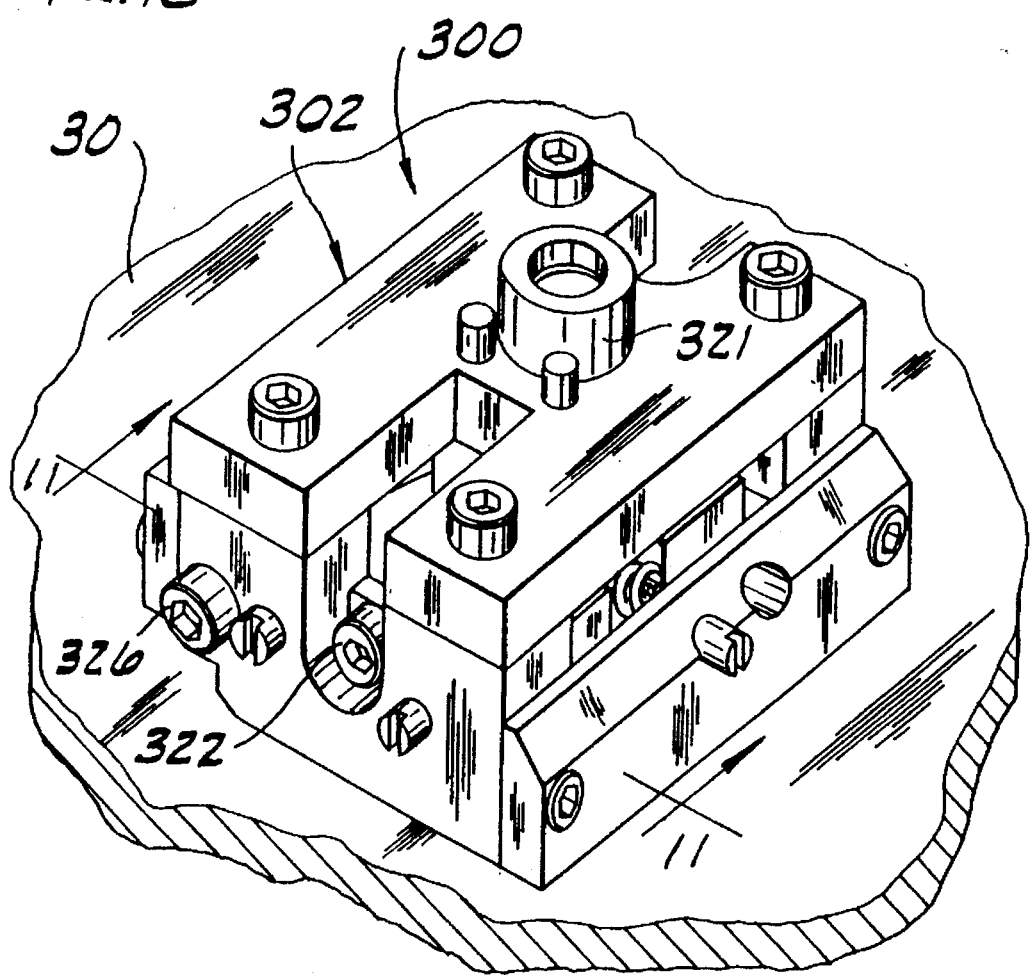
FIG. 10 is a perspective view of a third embodiment of a wire positioning apparatus of the present invention.
Figure 11:
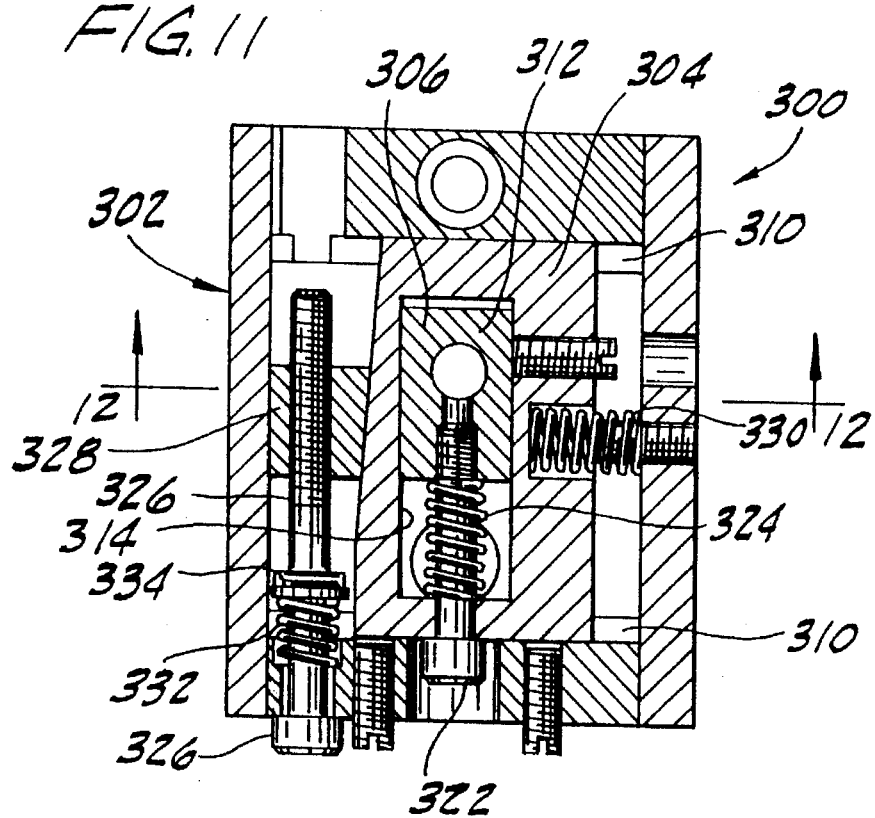
FIG. 11 is a cross-sectional view taken along the plane of line 11—11 of FIG. 10.
Figure 12:
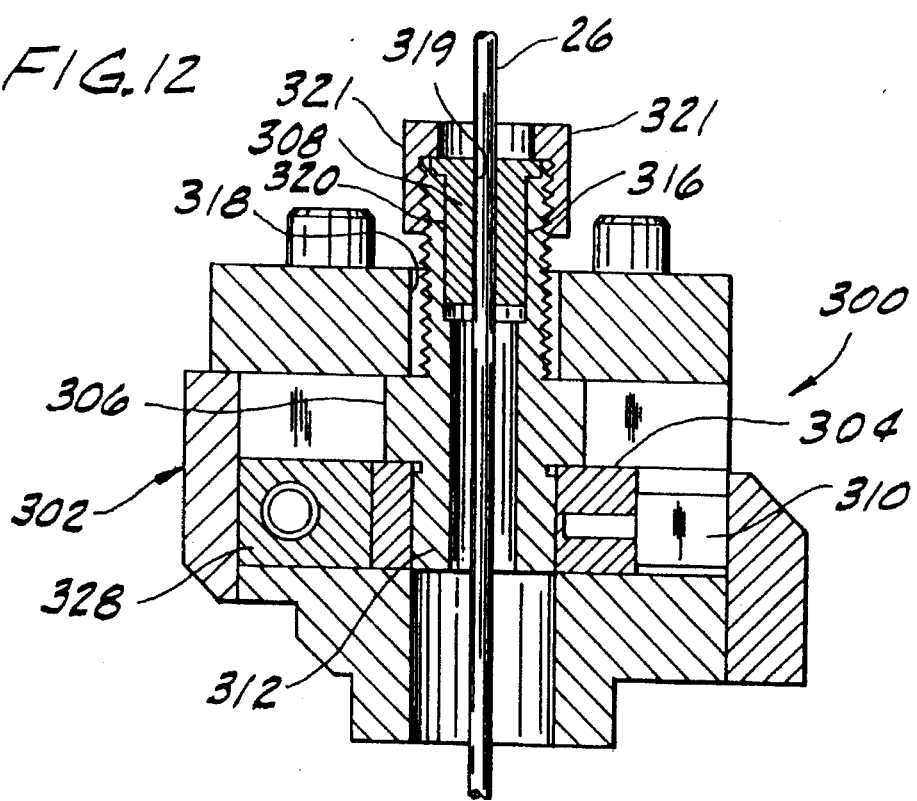
FIG. 12 is a cross-sectional view taken along the plane of line 12—12 of FIG. 11.

Referring now to FIGS. 10–12, a third embodiment of a wire positioning apparatus of the present invention is indicated generally at 300. Like wire positioning apparatus 252 of FIGS. 8 and 9, wire positioning apparatus 300 is adapted for adjusting the position of the pull wire only before a crystal growing process and does not actively dampen pendular motion. Unlike positioning apparatus 252, however, positioning apparatus 300 is secured to and rotates with the plate 30 to which the crystal lifting mechanism is attached.

The positioning apparatus 300 comprises a housing 302, a slider block 304, a bushing carrier 306, and a guide bushing 308. The housing 302 is securely fixed to the plate 30 via suitable fasteners (not shown). The slider block 304 is in the housing 302 and is sized and shaped for side-to-side sliding (right or left as viewed in FIG. 11) along channels 310 (FIG. 11) in the housing. The bushing carrier 306 has a downwardly projecting box-shaped portion 312 extending into a generally rectangular slot 314 in the slider block 304, and an upwardly projecting tubular portion 316 extending up through an opening 318 in the housing 302. The box-shaped portion 312 of the bushing carrier 306 is sized and shaped for forward and rearward sliding within the slot 314 (toward the top or bottom of the page as viewed in FIG. 11). The guide bushing 308 has a cylindric body 320 sized for a snug fit in an upper end of the tubular portion 316 of the bushing carrier 306. An opening 319 through guide bushing 308 is sized for passage therethrough of the pull wire 26. The guide bushing 308 is secured to the bushing carrier 306 by a threaded nut 321.

The shank of a first adjustment screw 322 extends through an opening in the slider block 304 and is threaded into the box-shaped portion 312 of the bushing carrier 306. A compression spring 324 within the slot 314 and surrounding the shank of the first adjustment screw 322 pushes against the box-shaped portion 312 of the bushing carrier 306 to bias the bushing carrier rearward (toward the top of the page as viewed in FIG. 11). Turning of the first adjustment screw 322 moves the bushing carrier and guide bushing 308 forward or rearward relative to the housing 302. The shank of a second adjustment screw 326 extends through an opening in the housing 302 and is threaded into a camming block 328. The camming block 328 has a sloped surface abutting a sloped surface of the slider block 304. A compression spring 330 biases the slider block 304 toward the left side of the housing 302 to keep the slider block in contact with the camming block 328. Another compression spring 332 surrounds the shank of the second adjustment screw 326 and engages the housing 302 and a circumferential flange 334 on the shank of the screw to bias the screw rearward relative to the housing. Turning the second adjustment screw causes forward or rearward movement of the camming block 328 which causes side-to-side movement of the slider block 304, bushing carrier 306, and guide bushing 308. Since the pull wire 26 moves laterally with the guide bushing 308, the lateral position of the pull wire can be adjusted by turning the first and second adjustment screws 322, 326. Thus, any eccentricity of the pull wire centerline with respect to the axis of rotation of the plate 30 and crystal lifting mechanism.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. Apparatus for adjusting the position of a pull wire of a crystal pulling machine for producing monocrystals by the Czochralski method, the crystal pulling machine including a growth chamber, a crucible in the growth chamber, a pulling chamber above the growth chamber, a rotatable support operatively mounted on the pulling chamber for rotation relative to the pulling chamber about a generally vertical axis $Z_1$, a crystal lifting mechanism supported by the rotatable support for rotation with the support, and a pull wire extending downward from the lifting mechanism for supporting a crystal, the apparatus comprising:

means for placing a guide around the pull wire, the guide having an opening therethrough for receiving the pull wire; and means for laterally adjusting the position of the guide relative to the axis $Z_1$ and relative to the rotatable support in at least two non-collinear, non-parallel lateral directions to thereby align the pull wire with the axis $Z_1$.

2. Apparatus as set forth in claim 1 wherein said placing means comprises a movable member connecting the guide to said lateral adjusting means, and wherein said lateral adjustment means comprises a first linear positioner mechanism mounted on the rotatable support and a second linear positioner mechanism mounted on the first linear positioner mechanism.

3. Apparatus for adjusting the position of a pull wire of a crystal pulling machine for producing monocrystals by the Czochralski method, the crystal pulling machine including a growth chamber, a crucible in the growth chamber, a pulling chamber above the growth chamber, a rotatable support operatively mounted on the pulling chamber for rotation relative to the pulling chamber about a vertical axis $Z_1$, a crystal lifting mechanism supported by the rotatable support for rotation with the support, and a pull wire extending downward from the lifting mechanism for supporting a crystal, the apparatus comprising:

a guide having an opening therethrough for passage of the pull wire; and an adjustment mechanism capable of laterally adjusting the position of the guide relative to the axis $Z_1$ and relative to the crystal lifting mechanism in at least two non-collinear and non-parallel lateral directions to thereby laterally adjust the position of the pull wire.

4. Apparatus as set forth in claim 3 wherein the guide is rotatable with the pull wire.

5. Apparatus as set forth in claim 4 further comprising a flexible coupling operatively connecting the guide to the rotatable support.

6. Apparatus as set forth in claim 3 wherein said adjustment mechanism comprises means for moving the guide in a plane generally perpendicular to the axis $Z_1$.

7. Apparatus as set forth in claim 3 wherein said adjustment mechanism is supported by and rotates with the rotatable support.

8. Apparatus as set forth in claim 3 wherein said adjustment mechanism comprises a first positioner mechanism for moving the guide in first and second opposite directions relative to the rotatable support, and a second positioner mechanism for moving the guide in third and fourth opposite directions relative to the rotatable support, said first and second directions being generally transverse to the third and fourth directions.

9. Apparatus as set forth in claim 8 wherein:

said first positioner mechanism mounts the second positioner mechanism on the rotatable support;

said second positioner mechanism couples the first positioner mechanism to the guide;

the first positioner mechanism is configured to selectively move the second positioner mechanism and the guide relative to the rotatable support in one of the first and second directions; and the second positioner mechanism is configured to selectively move the guide relative to the first positioner and the rotatable support in one of the third and fourth directions.

10. Apparatus as set forth in claim 9 wherein:

the first positioner mechanism comprises a first linear positioner mechanism for moving the guide in one of the first and second directions along an axis X;

the second positioner mechanism comprises a second linear positioner mechanism for moving the guide in one of the third and fourth directions along an axis Y; and said axes X and Y lie in a plane generally perpendicular to the generally vertical axis $Z_1$ of rotation of the rotatable support.

11. Apparatus as set forth in claim 3 wherein said adjustment mechanism comprises first and second positioner mechanisms for moving the guide in a plane generally perpendicular to the axis $Z_1$.

12. Apparatus as set forth in claim 11 wherein the first linear positioner mechanism is for moving the guide in first and second opposite directions within the plane, and the second linear positioner mechanism is for moving the guide in third and fourth opposite directions within the plane, the third and fourth directions being generally transverse to the first and second directions.

13. Apparatus as set forth in claim 3 wherein said adjustment mechanism comprises an actuator mechanism for laterally adjusting the position of the guide relative to the axis $Z_1$ during rotation of the pull wire to dampen vibration of the pull wire during production of a monocrystal.

14. Apparatus as set forth in claim 3 further comprising:

a moveable member operatively connected to said adjustment mechanism, the moveable member being laterally moveable by operation of said adjustment mechanism in at least two non-collinear, non-parallel lateral directions relative to the axis $Z_1$; and a bearing connecting the guide to the moveable member for conjoint movement of the moveable member and guide in said non-collinear, non-parallel lateral directions and for rotation of the guide relative to the moveable member;

said adjustment mechanism being operable to selectively adjust the position of the moveable member and the guide relative to the crystal pulling machine.

15. Apparatus as set forth in claim 14 wherein the bearing comprises first and second races, the first race being connected to the guide, and the second race being connected to the moveable member.

16. Apparatus as set forth in claim 15 further comprising a flexible coupling operatively connecting the guide to the rotatable support for causing the guide to rotate with the rotatable support while permitting lateral movement of the guide relative to the rotatable support.

17. Apparatus as set forth in claim 3 in combination with the crystal pulling machine.

18. Apparatus for adjusting the position of a pull wire of a crystal pulling machine to dampen pendular motion of the pull wire during production of a monocrystal, the crystal pulling machine being capable of producing monocrystals by the Czochralski method and including a growth chamber, a crucible in the growth chamber containing a molten polycrystalline material, a pulling chamber above the growth chamber, a rotatable support operatively mounted on the pulling chamber for rotation relative to the pulling chamber about a vertical axis $Z_1$, a crystal lifting mechanism supported by the rotatable support for rotation with the support, and a pull wire extending downward from the lifting mechanism for supporting a crystal, the apparatus comprising:

a guide having an opening therethrough for passage of the pull wire;

at least one position sensor for generating a position signal representative of the lateral position of a portion of the pull wire.

19. Apparatus as set forth in claim 18 wherein the position sensor is oriented such that the portion of the pull wire whose lateral position is sensed by the position sensor is located a distance d below the guide.

20. Apparatus as set forth in claim 19 wherein the distance d is at least approximately 5% of the distance between the guide and a surface of the molten polycrystalline material.

21. Apparatus as set forth in claim 18 wherein the position sensor comprises at least one photodiode for generating a photodiode signal which varies with illumination and is used for generating the position signal, and a light source for illuminating the photodiode, the photodiode and light source being arranged such that a portion of the pull wire shades an area of the photodiode from illumination by the light source and such that the light source illuminates an unshaded area of the photodiode, the size of the unshaded area of the photodiode being a function of the lateral position of the pull wire, the photodiode signal generated by the photodiode being a function of the unshaded area of the photodiode and a function of the lateral position of the pull wire.

22. Apparatus as set forth in claim 21 wherein the photodiode is adapted to admit light from the light source through a triangular opening.

23. Apparatus as set forth in claim 22 wherein the position sensor further comprises another photodiode arranged with respect to the light source and pull wire such that a portion of the pull wire shades an area of said other photodiode, said other photodiode being adapted to admit light from the light source through a triangular opening, the size of the unshaded area of said other photodiode being a function of the lateral position of the pull wire, a photodiode signal generated by said other photodiode being a function of the unshaded area of the photodiode and a function of the lateral position of the pull wire, and wherein the position signal comprises the photodiode signal generated by the photodiode less the photodiode signal generated by said other photodiode.

24. Apparatus as set forth in claim 22 wherein the triangular opening has the shape of a right triangle having a pair of legs and a hypotenuse, a first of the legs being generally parallel to a longitudinal axis of the pull wire, a second of the legs being generally perpendicular to the longitudinal axis of the pull wire and the hypotenuse being skew with respect to the longitudinal axis of the pull wire.

25. Apparatus as set forth in claim 18 wherein the actuator mechanism constitutes a first actuator mechanism for moving the guide in first and second opposite directions, said first actuator mechanism being controlled by the controller to dampen pendular motion in the first and second directions.

26. Apparatus as set forth in claim 25 further comprising a second actuator mechanism for moving the guide in third and fourth opposite directions which are generally transverse to the first and second opposite directions, said second actuator mechanism being controlled by the controller to dampen pendular motion in the third and fourth directions.

27. Apparatus as set forth in claim 18 wherein the sensor generates a generally periodic position signal representative of pendular motion of the pull wire, the controller comprising a phase shifter so that the actuator mechanism when controlled by the controller moves the guide in a periodic motion having generally the same frequency as the motion of the pull wire but lagging the motion of the pull wire by approximately ¼ cycle.

28. Apparatus as set forth in claim 18 wherein the sensor generates a generally periodic position signal representative of pendular motion of the pull wire, the controller comprising a phase shifter so that the actuator mechanism when controlled by the controller moves the guide in a periodic motion having generally the same frequency as the motion of the pull wire but being out of phase with the motion of the pull wire.

29. A method of laterally adjusting the position of a pull wire of a crystal pulling machine of the type which produces monocrystals by the Czochralski method, the crystal pulling machine including a growth chamber, a crucible in the growth chamber, a pulling chamber above the growth chamber, a rotatable support operatively mounted on the pulling chamber for rotation relative to the pulling chamber about a generally vertical axis $Z_1$, a crystal lifting mechanism supported by and rotatable with the rotatable support, and a pull wire extending downward from the lifting mechanism for supporting a crystal, the method comprising:

placing a guide around the pull wire, the guide having an opening therethrough for passage of the pull wire;

laterally adjusting the position of the guide relative to the axis $Z_1$ and relative to the rotatable support in at least two non-collinear, non-parallel lateral directions to align the pull wire with the axis $Z_1$; and lifting the crystal formed at the lower end of the pull wire out of the crucible by operation of the crystal lifting mechanism.

30. A method as set forth in claim 29 wherein the guide is rotatable with the rotatable support.

31. A method of laterally adjusting the position of a pull wire of a crystal pulling machine of the type which produces monocrystals by the Czochralski method, the crystal pulling machine including a growth chamber, a crucible in the growth chamber, a pulling chamber above the growth chamber, a rotatable support operatively mounted on the pulling chamber for rotation relative to the pulling chamber about a generally vertical axis $Z_1$, a crystal lifting mechanism supported by and rotatable with the rotatable support, and a pull wire extending downward from the lifting mechanism for supporting a crystal, the method comprising:

placing a guide around the pull wire, the guide having an opening therethrough for passage of the pull wire;

rotating the pulling chamber about the axis $Z_1$ to rotate both the pull wire and the crystal supported by the pull wire;

sensing the lateral position of a portion of the pull wire;

adjusting the lateral position of the guide in response to the sensed position of the pull wire; and lifting the crystal formed at the lower end of the pull wire out of the crucible by operation of the crystal lifting mechanism.

32. A method of laterally adjusting the position of a pull wire of a crystal pulling machine to dampen pendular motion of the pull wire during production of a monocrystal, the crystal pulling machine being of the type which produces monocrystals by the Czochralski method and including a growth chamber, a crucible in the growth chamber, a pulling chamber above the growth chamber, a rotatable support operatively mounted on the pulling chamber for rotation relative to the pulling chamber about a generally vertical axis $Z_1$, a crystal lifting mechanism supported by and rotatable with the rotatable support, and a pull wire extending downward from the lifting mechanism for supporting a crystal, the method comprising:

placing a guide around the pull wire, the guide having an opening therethrough for passage of the pull wire;

rotating the pulling chamber about the axis $Z_1$ to rotate both the pull wire and the crystal supported by the pull wire;

sensing the lateral position of a portion of the pull wire;

adjusting the lateral position of the guide in response to the sensed position of the pull wire to dampen pendular motion of the pull wire during production of a monocrystal; and lifting the crystal formed at the lower end of the pull wire out of the crucible by operation of the crystal lifting mechanism.

33. A method as set forth in claim 32 wherein the sensing step comprises continuously sensing the lateral position of the portion of the pull wire.

34. A method as set forth in claim 33 wherein the adjusting step comprises continuously adjusting the lateral position of the guide in response to the sensed position of the pull wire.

35. Apparatus for adjusting the position of a pull wire of a crystal pulling machine, the crystal pulling machine being capable of producing monocrystals by the Czochralski method and including a growth chamber, a crucible in the growth chamber containing a molten polycrystalline material, a pulling chamber above the growth chamber, a rotatable support operatively mounted on the pulling chamber for rotation relative to the pulling chamber about a vertical axis $Z_1$, a crystal lifting mechanism supported by the rotatable support for rotation with the support, and a pull wire extending downward from the lifting mechanism for supporting a crystal, the apparatus comprising:

a guide having an opening therethrough for passage of the pull wire;

at least one position sensor for generating a position signal representative of the lateral position of a portion of the pull wire;

the position sensor comprising at least one photodiode for generating a photodiode signal which varies with illumination and is used for generating the position signal, and a light source for illuminating the photodiode, the photodiode and light source being arranged such that a portion of the pull wire shades an area of the photodiode from illumination by the light source and such that the light source illuminates an unshaded area of the photodiode, the size of the unshaded area of the photodiode being a function of the lateral position of the pull wire, the photodiode signal generated by the photodiode being a function of the unshaded area of the photodiode and a function of the lateral position of the pull wire, the photodiode being adapted to admit light through a triangular opening;

an actuator mechanism capable of adjusting the lateral position of the guide in response to a correction signal; and a controller configured to calculate the correction signal in response to the position signal from the sensor, said controller controlling the actuator mechanism for changing the lateral position of the guide in response to the position of the pull wire.

36. Apparatus as set forth in claim 35 wherein the position sensor further comprises another photodiode arranged with respect to the light source and pull wire such that a portion of the pull wire shades an area of said other photodiode, said other photodiode being adapted to admit light from the light source through a triangular opening, the size of the unshaded area of said other photodiode being a function of the lateral position of the pull wire, a photodiode signal generated by said other photodiode being a function of the unshaded area of the photodiode and a function of the lateral position of the pull wire, and wherein the position signal comprises the photodiode signal generated by the photodiode less the photodiode signal generated by said other photodiode.

37. Apparatus as set forth in claim 35 wherein the triangular opening has the shape of a right triangle having a pair of legs and a hypotenuse, a first of the legs being generally parallel to a longitudinal axis of the pull wire, a second of the legs being generally perpendicular to the longitudinal axis of the pull wire and the hypotenuse being skew with respect to the longitudinal axis of the pull wire.

* * * * *

UNITED STATES PATENT AND TRADEMARK OFFICE
CERTIFICATE OF CORRECTION

PATENT NO. : 5,582,642
DATED : December 10, 1996
INVENTOR(S) : Harold W. Korb, Dick S. Williams
Richard G. Schrenker and Verlin A. Lauher It is certified that error appears in the above-identified patent and that said Letters Patent is hereby corrected as shown below:

In Column 12, Claim 18, line 41 "pull wire." should read --pull wire;
an actuator mechanism capable of adjusting the lateral position of the guide in response to a correction signal; and
a controller configured to calculate the correction signal in response to the position signal from the sensor, said controller controlling the actuator mechanism for changing the lateral position of the guide in response to the position of the pull wire to dampen pendular motion of the pull wire during production of a monocrystal.--.

Signed and Sealed this

Sixth Day of May, 1997

*Attest:*

*Attesting Officer*

BRUCE LEHMAN

*Commissioner of Patents and Trademarks*